(12) United States Patent
Kim et al.

(10) Patent No.: US 8,144,507 B2
(45) Date of Patent: Mar. 27, 2012

(54) METHOD OF MEASURING A RESISTANCE OF A RESISTIVE MEMORY DEVICE

(75) Inventors: Young-Kuk Kim, Seoul (KR); Mi-Lim Park, Bucheon-si (KR); Hori Ihideki, Seoul (KR); Dong-Seok Suh, Hwaseong-si (KR)

(73) Assignee: Samsung Electronics Co., Ltd. (KR)

( * ) Notice: Subject to any disclaimer, the term of this patent is extended or adjusted under 35 U.S.C. 154(b) by 16 days.

(21) Appl. No.: 12/872,396

(22) Filed: Aug. 31, 2010

(65) Prior Publication Data

US 2011/0051497 A1    Mar. 3, 2011

(30) Foreign Application Priority Data

Sep. 2, 2009 (KR) .................. 10-2009-0082357

(51) Int. Cl.
*G11C 11/00* (2006.01)
*G11C 7/00* (2006.01)
(52) U.S. Cl. .................. 365/163; 365/148; 365/201
(58) Field of Classification Search .................. 365/163
See application file for complete search history.

(56) References Cited

U.S. PATENT DOCUMENTS

| 6,831,856 B2 * | 12/2004 | Pashmakov ............... 365/163 |
| 7,190,607 B2 * | 3/2007 | Cho et al. ............... 365/148 |
| 2011/0069539 A1 * | 3/2011 | Eleftheriou et al. ........ 365/163 |
| 2011/0110144 A1 * | 5/2011 | Kawai et al. ............. 365/148 |

FOREIGN PATENT DOCUMENTS

| JP | 2006-155700 | 6/2006 |
| KR | 1020050118332 A | 12/2005 |
| KR | 1020060121567 A | 11/2006 |

\* cited by examiner

*Primary Examiner* — Son Mai
(74) *Attorney, Agent, or Firm* — Myers Bigel Sibley & Sajovec, P.A.

(57) ABSTRACT

A method of measuring a resistance of a memory cell in a resistive memory device can be provided by applying a data write pulse to a selected cell of the resistive memory device, applying a resistance read pulse to the selected cell after a delay time measured from a time of applying the data write pulse, measuring a drop voltage at the cell responsive to a pulse waveform output when applying the resistance read pulse to the selected cell, measuring a total current through the cell using the drop voltage and an internal resistance of a test device coupled to the cell, and determining a resistance of the resistive memory device using the total current and a voltage of the resistance read pulse.

9 Claims, 8 Drawing Sheets

US 8,144,507 B2

METHOD OF MEASURING A RESISTANCE OF A RESISTIVE MEMORY DEVICE

REFERENCE TO RELATED APPLICATION

This application claims priority under 35 USC §119 to Korean Patent Application No. 2009-82357, filed on Sep. 2, 2009 in the Korean Intellectual Property Office (KIPO), the contents of which are herein incorporated by reference in their entirety.

BACKGROUND

1. Field

Example embodiments according to the inventive concept relate to a method of measuring a resistance of a resistive memory device and a system for performing the same. More particularly, example embodiments according to the inventive concept relate to a method of measuring a resistance of a resistive memory device just after writing data in a cell of the resistive memory device, and a system for performing the method.

2. Description of the Related Art

A resistive memory device may store data in cells of the resistive memory device using resistance changes. Thus, the cells may store different data by providing different respective resistances. A method of measuring the resistances of the cells in accordance with the data may include writing the data in the cells, and applying a direct current to the cell.

However, a time for measuring the resistance may be at least about 0.1 second. Particularly, a time for accurately measuring the resistance may be no less than about 1 second. Therefore, after writing the data in the cell, it may be difficult to measure the resistance of the cell in 1 second.

SUMMARY

According to some example embodiments according to the inventive concept, a method of measuring a resistance of a memory cell in a resistive memory device can be provided by applying a data write pulse to a selected cell of the resistive memory device, applying a resistance read pulse to the selected cell after a delay time measured from a time of applying the data write pulse, measuring a drop voltage at the cell responsive to a pulse waveform output when applying the resistance read pulse to the selected cell, measuring a total current through the cell using the drop voltage and an internal resistance of a test device coupled to the cell, and determining a resistance of the resistive memory device using the total current and a voltage of the resistance read pulse.

According to some example embodiments according to the inventive concept, a system for measuring a resistance of a memory cell in a resistive memory device, can include a pulse generator configured to apply a data write pulse and a resistance read pulse to the resistive memory device with a delay time. A connecting member is connected between the pulse generator and the resistive memory device. A test measurement device is connected to the resistive memory device outputting a pulse waveform and a data-processing member is configured to determine the resistance of the resistive memory device using the pulse waveform and an internal resistance of the test measurement device, According to some example embodiments according to the inventive concept, the resistance may be accurately measured just after about several to hundreds nano seconds from writing the data in the resistive memory device. The measured resistance may be used for determining operational characteristics and reliability of the resistive memory device, and for setting the read sensing margin and data determination voltage of the resistive memory device.

DETAILED DESCRIPTION OF THE EMBODIMENTS ACCORDING TO THE INVENTIVE CONCEPT

Figure 1:
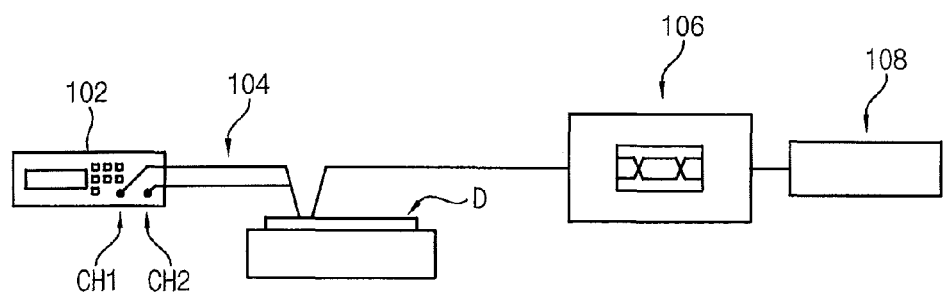
FIG. 1 is a block diagram illustrating a system for measuring a resistance of a resistive memory device in accordance with some example embodiments according to the inventive concept.

Various example embodiments will be described more fully hereinafter with reference to the accompanying drawings, in which some example embodiments are shown. The present invention may, however, be embodied in many different forms and should not be construed as limited to the example embodiments set forth herein. Rather, these example embodiments are provided so that this disclosure will be thorough and complete, and will fully convey the scope of the present invention to those skilled in the art. In the drawings, the sizes and relative sizes of layers and regions may be exaggerated for clarity.

It will be understood that when an element or layer is referred to as being "on," "connected to" or "coupled to" another element or layer, it can be directly on, connected or coupled to the other element or layer or intervening elements or layers may be present. In contrast, when an element is referred to as being "directly on," "directly connected to" or "directly coupled to" another element or layer, there are no intervening elements or layers present. Like numerals refer to like elements throughout. As used herein, the term "and/or" includes any and all combinations of one or more of the associated listed items.

It will be understood that, although the terms first, second, third etc. may be used herein to describe various elements, components, regions, layers and/or sections, these elements, components, regions, layers and/or sections should not be limited by these terms. These terms are only used to distinguish one element, component, region, layer or section from another region, layer or section. Thus, a first element, component, region, layer or section discussed below could be termed a second element, component, region, layer or section without departing from the teachings of the present invention.

The terminology used herein is for the purpose of describing particular example embodiments only and is not intended to be limiting of the present invention. As used herein, the singular forms "a," "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof.

Unless otherwise defined, all terms (including technical and scientific terms) used herein have the same meaning as commonly understood by one of ordinary skill in the art to which this invention belongs. It will be further understood that terms, such as those defined in commonly used dictionaries, should be interpreted as having a meaning that is consistent with their meaning in the context of the relevant art and will not be interpreted in an idealized or overly formal sense unless expressly so defined herein.

Hereinafter, example embodiments will be explained in detail with reference to the accompanying drawings.

FIG. 1 is a block diagram illustrating a system for measuring a resistance of a resistive memory device in accordance with some example embodiments.

Referring to FIG. 1, a system 100a for measuring a resistance of a resistive memory device D may include a pulse generator 102, an oscilloscope 106, a connecting member 104 and a data-processing member 108. Although much of the description herein refers to an oscilloscope for use in measuring parameters, any equivalent test device may be used.

In some example embodiments, the resistive memory device D may be formed on a semiconductor substrate. The semiconductor substrate may be positioned on a stage. The resistive memory device D may have variable resistances in accordance with time. Particularly, the resistive memory device D may include a phase changeable memory device, a magnetic memory device, an oxide memory device, etc. A test element group (TEG) may have a structure substantially the same as that of a unit element in cells and peripheral circuits of the resistive memory device D. The TEG may be used for testing electrical characteristics of the cells and the peripheral circuits. A resistance may be measured at the TEG.

The connecting member 104 may be connected between terminals of the resistive memory device D and the pulse generator 102, and the terminals of the resistive memory device D and the oscilloscope 106. In some example embodiments, the connecting member 104 may include probes configured to directly make contact with the terminals of the resistive memory device D.

The pulse generator 102 may generate a pulse signal such as a pulse voltage, a pulse current, etc. The pulse generator 102 may apply the pulse voltage or the pulse current with a desired period to the resistive memory device D. In some example embodiments, the pulse generator 102 may apply two different pulses with time delay to the resistive memory device D.

For example, the pulse generator 102 may include a plurality of channels CH1 and CH2 for applying the pulses. Thus, different pulse voltages may be generated from the channels CH1 and CH2. The different pulse voltage may be applied to the resistive memory device D.

The oscilloscope 106 may monitor the pulse waveforms outputted through the cells of the resistive memory device D from the pulses of the pulse generator 102. The pulse voltage may be measured using the pulse waveforms. In some example embodiments, when the resistance read pulse may be applied to the resistive memory device D, a drop voltage, which may be generated in the resistive memory device D, may be measured using the pulse waveform of the oscilloscope 106.

The data-processing member 108 may measure resistances of the resistive memory device D using the pulse waveform outputted from the oscilloscope 106 and an internal resistance of the oscilloscope 106.

Particularly, the data-processing member 108 may obtain an entire current, which may flow through the resistive memory device D, from the drop voltage measured by the oscilloscope 106 and the internal resistance of the oscilloscope 106. Further, the data-processing member 108 may obtain the resistance of the resistive memory device D using the entire current and a voltage of the resistance read pulse.

According to this example embodiment, the resistance of the cell may be accurately measured just after data may be written in the cell of the resistive memory device using the system.

Figure 2:
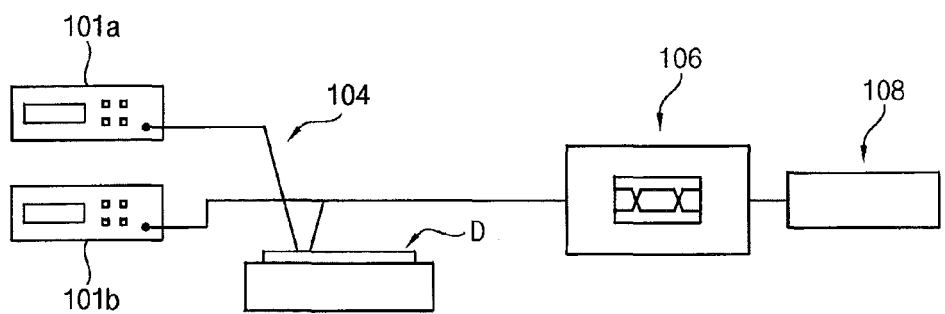
FIG. 2 is a block diagram illustrating a system for measuring a resistance of a resistive memory device in accordance with some example embodiments according to the inventive concept.

FIG. 2 is a block diagram illustrating a system for measuring a resistance of a resistive memory device in accordance with some example embodiments.

Referring to FIG. 2, a system 100b of this example embodiment may include the oscilloscope 106, the connecting member 104 and the data-processing member 108. Two pulse generators 101a and 101b may be connected to the resistive memory device D. The pulse generators 101a and 101b may periodically generate two pulse voltages. Thus, the two different pulse voltages may be applied to the resistive memory device D with time delay.

Figure 3:
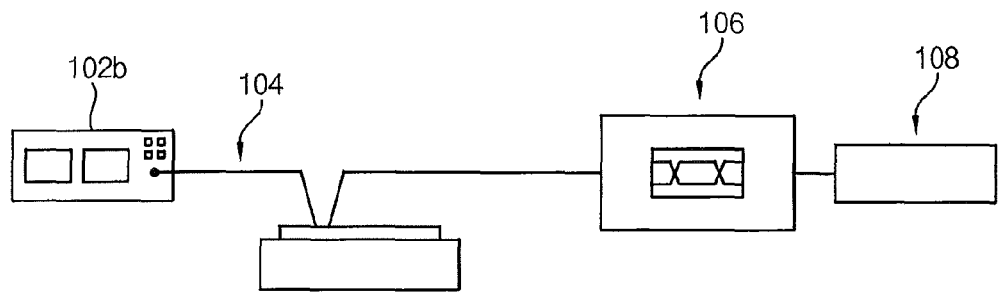
FIG. 3 is a block diagram illustrating a system for measuring a resistance of a resistive memory device in accordance with some example embodiments according to the inventive concept.

FIG. 3 is a block diagram illustrating a system for measuring a resistance of a resistive memory device in accordance with some example embodiments.

Referring to FIG. 3, a system 100c of this example embodiment may include the oscilloscope 106, the connecting member 104 and the data-processing member 108. An arbitrary pulse generator 102b may be connected to the resistive memory device D. In some example embodiments, the arbitrary pulse generator 102b may have a single channel for periodically generating at least two pulse voltages. Thus, the two different pulse voltages may be applied to the resistive memory device D with time delay.

According to these example embodiments, the resistance of the cell may be accurately measured just after data may be written in the cell of the resistive memory device using the system.

Here, it may be desired to accurately measure the resistance of the cell just after writing data in the cell in view of determining operational characteristics and reliability of the resistive memory device. Particularly, when a resistance measured just after writing data in the cell may be different from a resistance measured long after writing data in the cell, it may be more desirable to accurately measure the resistance of the cell just after writing data in the cell.

When the resistive memory device may include a phase changeable memory device, the phase changeable memory device may have increasing voltages with the passage of time in a condition that a data "1" may be written in a cell to provide the cell with a reset state, i.e., a high resistance. Therefore, it may be desirable to accurately measure a resistance of the cell in the phase changeable memory device just after writing data in the cell.

Figure 4:
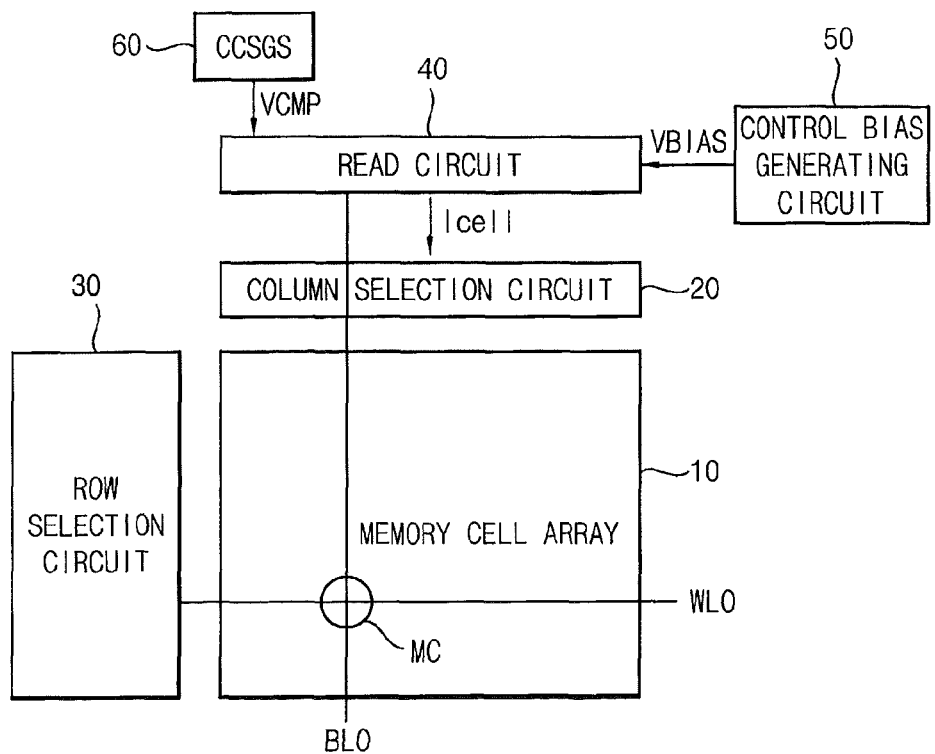
FIG. 4 is a block diagram illustrating a phase changeable memory device in accordance with some example embodiments according to the inventive concept.

FIG. 4 is a block diagram illustrating a phase changeable memory device in accordance with some example embodiments.

Referring to FIG. 4, a phase changeable memory device 150 of this example embodiment may include a memory cell array 10, a column selection circuit 20, a row selection circuit 30, a read circuit 40, a control bias generating circuit 50 and a clamp control signal generating circuit (CCSGS) 60.

In some example embodiments, the memory cell array 10 may include a plurality of phase changeable memory cells MC arranged in a matrix. The phase changeable memory cell MC may include a variable resistance-condenser and an access condenser. The variable resistance-condenser may include a phase changeable material having different two resistances in accordance with a crystalline state and an amorphous state. The access condenser may control a current flowing through the variable resistance-condenser.

In some example embodiments, the access condenser may include a diode, a transistor, etc., serially coupled to the variable resistance-condenser. The phase changeable material may include GaSb, InSb, InSe, $Sb_2Te_3$, GeTe, GeSbTe, GaSeTe, InSbTe, $SnSb_2Te_4$, InSbGe, AgInSbTe, (GeSn)SbTe, GeSb(SeTe), $Te_{81}Ge_{15}Sb_2S_2$, etc.

The column selection circuit 20 may select a word line WL0 among a plurality of word lines WL0-WLm. The row selection circuit 30 may select a bit line BL0 among a plurality of bit lines BL0-BLn.

The read circuit 40 may read data in a non-volatile memory cell MC selected from the memory cell array 10. In some example embodiments, the read circuit 40 may provide the selected non-volatile memory cell MC by a control bias VBIAS with a read bias Icell to read a resistance of the phase changeable memory cell MC.

Here, a resistance measured just after writing data in the cell of the phase changeable memory device may be different from a resistance measured long after writing data in the cell of the phase changeable memory device. Particularly, just after a data "1" may be written in the cell, the cell may have a low resistance because the resistance of the cell may not be sufficiently increased. Thus, when the data in the cell may be read, the cell may be determined to be abnormal. In contrast, long after a data "1" may be written in the cell, the cell may have a high resistance because the resistance of the cell may be sufficiently increased. Thus, when the data in the cell may be read, the cell may be determined to be normal. Therefore, in order to accurately determine operational characteristics of the phase changeable memory device, it may be desirable to accurately measure the resistance just after writing the data "1" in the cell.

Figure 5:
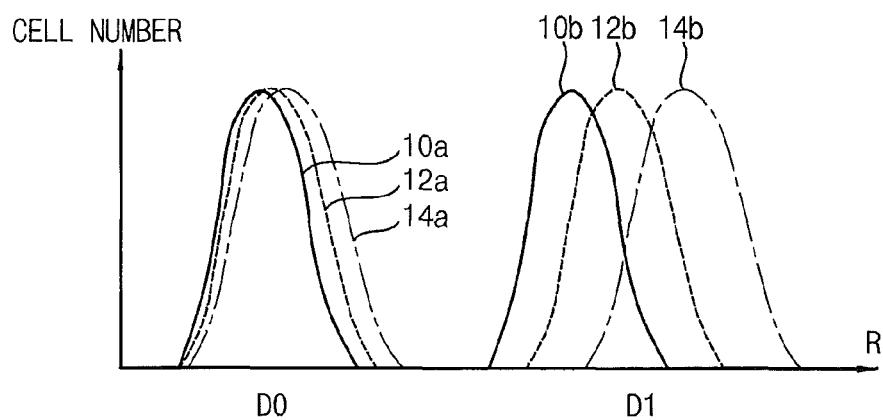
FIG. 5 is a graph showing a resistance of the phase changeable memory device in FIG. 4 in accordance with writing of data and time delay according to the inventive concept.

FIG. 5 is a graph showing a resistance of the phase changeable memory device in FIG. 4 in accordance with writing of data and time delay.

In FIG. 5, reference numerals may represent resistances under following Table 1.

TABLE 1

| | Reference numeral | | | | | |
|---|---|---|---|---|---|---|
| | 10a | 10b | 12a | 12b | 14a | 14b |
| Data | 0 | 1 | 0 | 1 | 0 | 1 |
| Toff | 500 ns | 500 ns | 1 second | 1 second | 10 years | 10 years |

Referring to FIG. 1, when the data "1" may be written in the cell of the phase changeable memory device, the resistance may be increased with the passage of time (See 10b, 12b and 14b). In contrast, when the data "0" may be written in the cell of the phase changeable memory device to provide the cell with a set state, the resistance may not be changed (See 10a, 12a and 14a). Thus, the resistance with the passage of time just after writing the data "1" may be needed.

Figure 6:
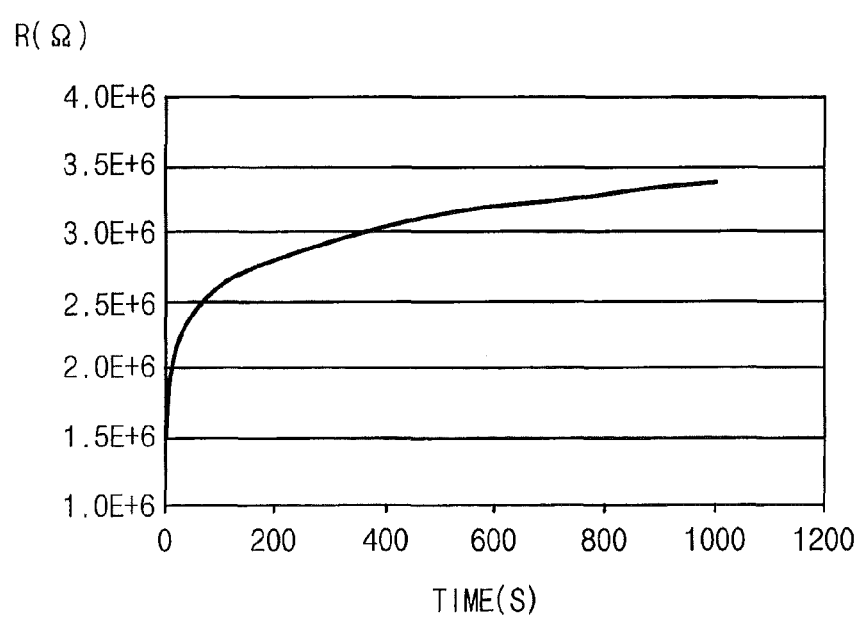
FIG. 6 is a graph showing a resistance of a phase changeable material in the phase changeable memory device in FIG. 4 when the phase changeable material is an amorphous state according to the inventive concept.

FIG. 6 is a graph showing a resistance of a phase changeable material in the phase changeable memory device in FIG. 4 when the phase changeable material is an amorphous state.

Referring to FIG. 6, after the phase changeable material may be converted into an amorphous state, the resistance of the phase changeable material may be gradually increased. Here, the resistance of the amorphous phase changeable material may be represented as a following Formula 1.

$$R(t)=R_0 T^d$$ Formula 1

In Formula, $R_0$ may indicate an initial resistance just after the phase changeable material may be converted into the amorphous state, and d may represent a drift coefficient.

The resistance of the phase changeable material may be increased with the passage of time, after the phase changeable material may be converted into the amorphous state. Therefore, it may be noted that the resistance may be increased with the passage of time, when the data "1" may be written in the cell of the phase changeable memory device.

Here, when the resistance of the phase changeable memory device may be measured using a DC voltage, a resistance after no less than about 0.1 seconds from writing the data "1" in the phase changeable memory device may be measured. This may be caused by an input/output time of no less than about 0.1 seconds of the DC voltage in terminals of the cell.

Further, although a resistance of the cell measured by a conventional method may be desirably high, the phase changeable memory device may be malfunctioned. For example, a resistance of the cell before about 0.1 seconds from writing the data "1" in the phase changeable memory device may be lower than the measured resistance. Therefore, when the written data may be read before about 0.1 seconds from writing the data "1", the cell may be malfunctioned.

As a result, it may be desirable to accurately measure the resistance of the resistive memory device just after writing the data in the resistive memory device in view of determining reliability and operational characteristics of the resistive memory device. Particularly, it may be desirable to accurately measure a resistance of a reset resistive memory device.

Hereinafter, methods of measuring a resistance of a resistive memory device may be illustrated in detail. Here, the method may use the systems in FIGS. 1 to 3.

Figure 7:
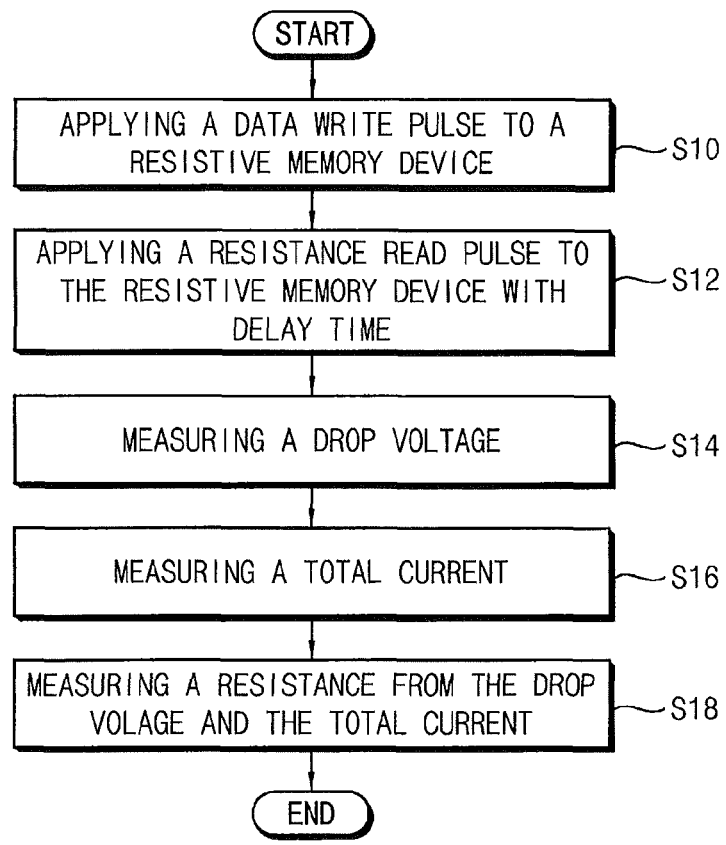
FIG. 7 is a flow chart illustrating a method of measuring a resistance of a resistive memory device in accordance with some example embodiments according to the inventive concept.
Figure 8:
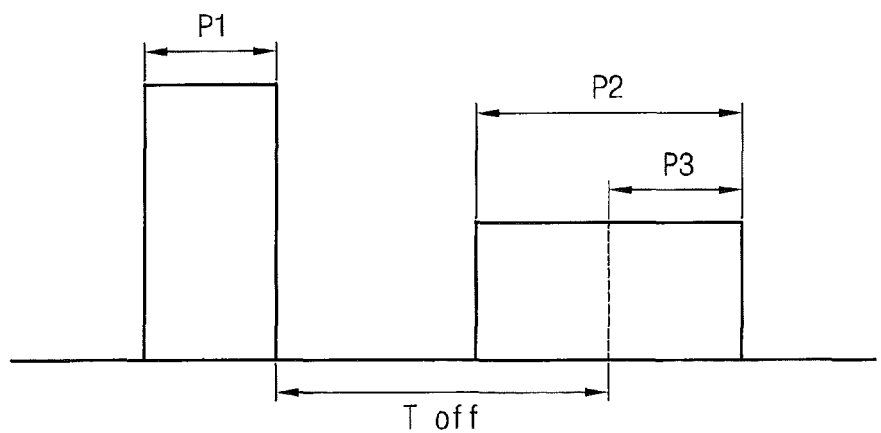
FIG. 8 is a timing chart showing a data write pulse and a data read pulse.
Figure 9:
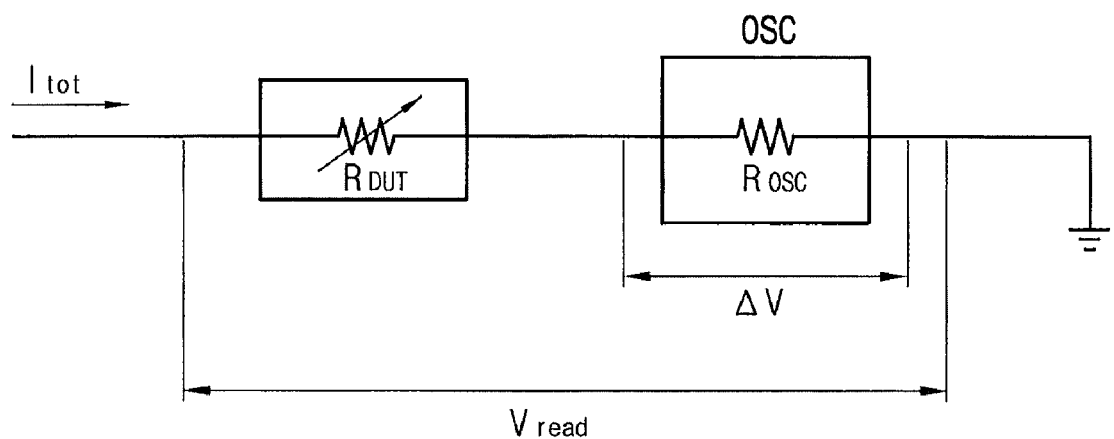
FIG. 9 is an equivalent circuit diagram illustrating a resistance measurement scheme.

FIG. 7 is a flow chart illustrating a method of measuring a resistance of a resistive memory device in accordance with some example embodiments, FIG. 8 is a timing chart showing a data write pulse and a data read pulse, and FIG. 9 is an equivalent circuit diagram illustrating a resistance measurement scheme.

In this example embodiment, the resistive memory device may include the phase changeable memory device. After writing the data "1" in the phase changeable memory device to provide the phase changeable memory device with a reset state, the resistance of the cell may be measured.

Alternatively, when the resistance of the cell may be measured after writing the data "0" to provide the phase changeable memory device with a set state, this method may include processes substantially the same as those of the method in FIG. 7 except that a data write pulse may be controlled to write the data "0".

Further, the cell of the resistive memory cell may be positioned in the TEG on a semiconductor substrate on which the resistive memory device may be formed.

Referring to FIGS. 7 to 9, the pulse generator may be connected to the cell of the phase changeable memory device. The phase changeable memory device may be connected to the oscilloscope to display pulses outputted from the phase changeable memory device.

In step S10, a data write pulse P1 may be applied to the cell of the phase changeable memory device. In some example embodiments, the data write pulse P1 may include a voltage pulse for writing the data "1" in the cell. The voltage of the data write pulse P1 may be about 3V to about 5V.

In step S12, a resistance read pulse P2 may be applied to the cell of the phase changeable memory device after a time delay from applying the data write pulse P1. The resistance read pulse P2 may be used for reading the resistance of the cell. Thus, it may be needed to prevent the data in the cell from being changed or rewritten by the resistance read pulse P2. In some example embodiments, the resistance read pulse P2 may have a voltage lower than that of the data write pulse P1. For example, the resistance read pulse P2 may be about 1.3V to about 1.5V.

Here, resistances by times after writing the data in the cell of the phase changeable memory device may be measured by controlling the time delay between the data write pulse P1 and the resistance read pulse P2.

In some example embodiments, a time between an end point of the data write pulse P1 and a start point of a stabilization period P3 in the resistance read pulse P2 may correspond to a time from writing the data in the cell to measuring the resistance. Hereinafter, the time between the end point of the data write pulse P1 and the start point of the stabilization period P3 in the resistance read pulse P2 may be referred to as a delay time Toff.

That is, in order to measure a resistance after a specific time from writing the data in the cell, the delay time Toff may be set as the specific time. For example, in order to measure about 100 ns from writing the data in the cell, an applying time of the resistance read pulse P2 may be adjusted to set the delay time Toff to be about 100 ns, Here, the stabilization period P3 in the resistance read pulse P2 may correspond to a period in which a stable pulse voltage may be applied without noises by an overshooting in the resistance read pulse P2. For example, the noises may be generated in an initial period in the resistance read pulse P2. Thus, the stabilization period P3 may be ranged between a half point and an end point in the resistance read pulse P2. Alternatively, the start point of the stabilization period P3 may be before or after the half point in the resistance read pulse P2.

In some example embodiments, the delay time Toff may be about 10 ns to about 1 second. Therefore, after writing the data '1" in the cell of the phase changeable memory device, a resistance of the cell may be measured after about 10 ns.

Alternatively, when the delay time Toff may be about 1 second, the resistance of the cell may be accurately measured using the method of this example embodiment. Here, when the delay time Toff may be sufficiently long, the resistance of the cell may be measured using the DC voltage. However, when the delay time Toff may be within hundreds of nano seconds, the resistance of the cell may be measured only using the method of this example embodiment.

In some example embodiments, the data write pulse P1 and the resistance read pulse P2 may be applied with the delay time Toff using following processes.

The channels in the single pulse generator in FIG. 1 may generate the data write pulse P1 and the resistance read pulse P2.

Alternatively, the two pulse generators in FIG. 2 may generate the data write pulse P1 and the resistance read pulse P2, respectively.

Further, the single channel of the arbitrary pulse generator in FIG. 3 may generate an incorporated pulse including the data write pulse P1 and the resistance read pulse P2.

When the data write pulse P1 and the resistance read pulse P2 may be sequentially applied with the delay time Toff, the oscilloscope may display a pulse waveform of the cell.

In step S14, when the resistance read pulse P2 may be applied, a drop voltage ΔV caused by a voltage drop may be measured from the pulse waveform outputted from the cell of the phase changeable memory device. Here, the drop voltage ΔV may correspond to a voltage difference of the resistance read pulse P2 that may pass through the cell in which the data "1" may be written. That is, the drop voltage ΔV may correspond to a pulse voltage difference between the pulse waveform outputted when applying the data write pulse P1 and the pulse waveform outputted when applying the resistance read pulse P2.

In some example embodiments, the drop voltage ΔV may correspond to a voltage measured between both ends of the oscilloscope. Thus, the drop voltage ΔV may be directly obtained from the oscilloscope.

In step S16, a total current Itot flowing through the cell of the phase changeable memory device may be obtained from the drop voltage ΔV and an internal resistance Rosc of the oscilloscope. The total current Itot may be calculated by following Formula 2.

$$Itot = \Delta V / Rosc \qquad \text{Formula 2}$$

In some example embodiments, the internal resistance of the oscilloscope may be no more than about 1,000Ω, generally about 50Ω.

In step S18, a resistance RDUT of the cell in which the data "1" may be written may be obtained using the total current Itot and the voltage Vread of the resistance read pulse P2. In some example embodiments, the resistance RDUT may be calculated by following Formula 3.

$$RDUT = (V\text{read}/Itot) - Rosc \qquad \text{Formula 3}$$

According to this example embodiment, the resistance of the cell may be accurately measured after a desired delay time from writing the data in the cell of the resistive memory device.

Further, a time from writing the data in the cell to sensing the data may be obtained based on the resistance of the phase changeable memory device. Therefore, a time margin for reading the data may be accurately obtained after writing the data in the cell.

Figure 10:
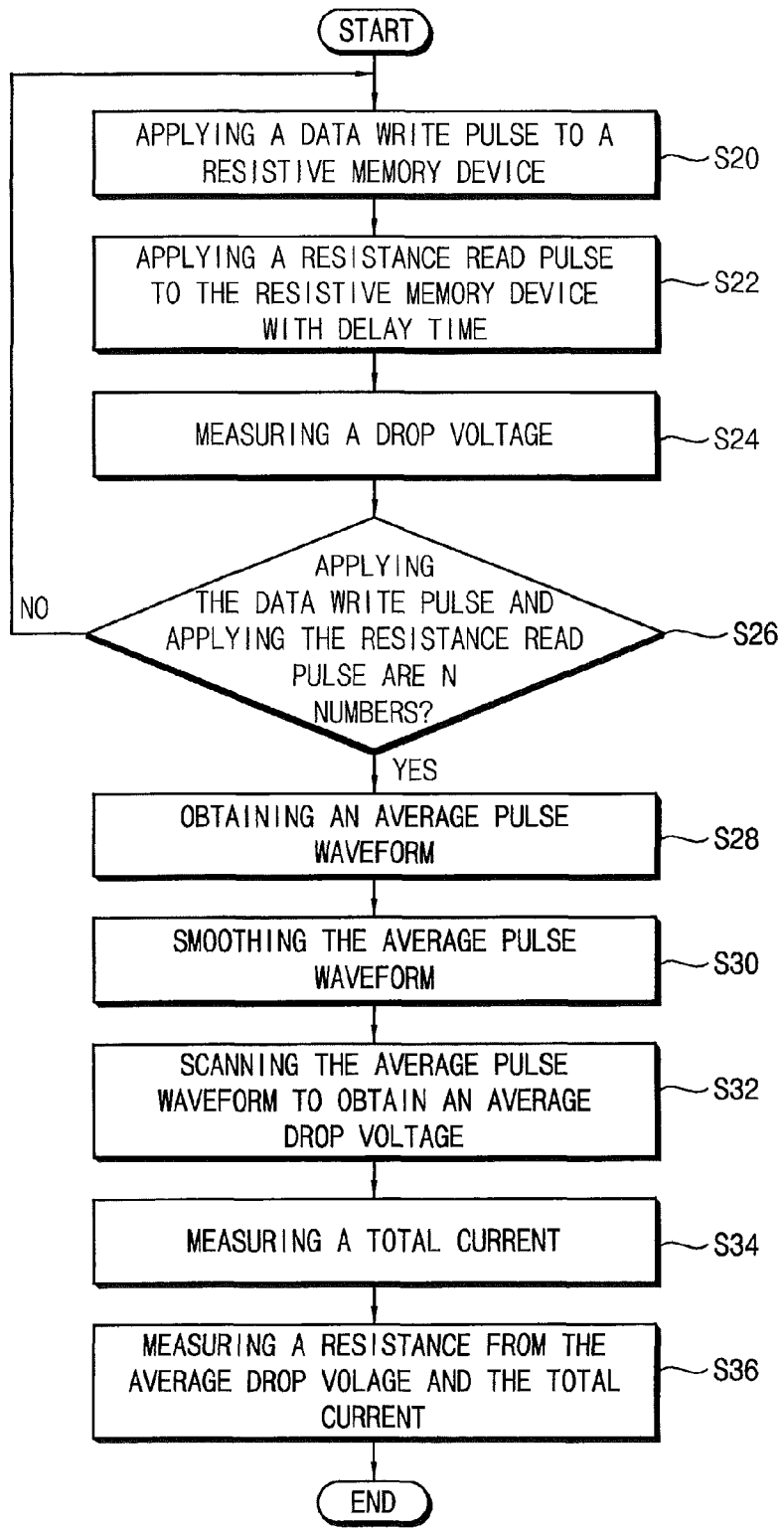
FIG. 10 is a flow chart illustrating a method of measuring a resistance of a resistive memory device in accordance with some example embodiments according to the inventive concept.

FIG. 10 is a flow chart illustrating a method of measuring a resistance of a resistive memory device in accordance with some example embodiments.

Referring to FIG. 10, in step S20, a data write pulse may be applied to a cell of a phase changeable memory device.

In step S22, a resistance read pulse may be applied to the cell of the phase changeable memory device after a delay time from applying the data write pulse, In step S24, a drop voltage may be measured from a pulse waveform outputted from the cell when applying the resistance read pulse to the cell.

In step S26, applying the data write pulse and applying the resistance read pulse may be repeatedly performed. That is, a cycle including applying the data write pulse and applying the resistance read pulse may be performed.

In step S28, the drop voltages measured by the resistance read pulses may be averaged to obtain an average pulse waveform.

In step S30, the average pulse waveform may be smoothed to remove noises from the average pulse waveform. In some example embodiments, smoothing the average pulse waveform may function as to remove data offset from a trend of the average pulse waveform so as to display the average pulse waveform in the trend.

In step S32, a period of the smoothed average pulse waveform may be scanned. Drop voltages in the scanned period may be averaged to obtain an average drop voltage.

Figure 11:
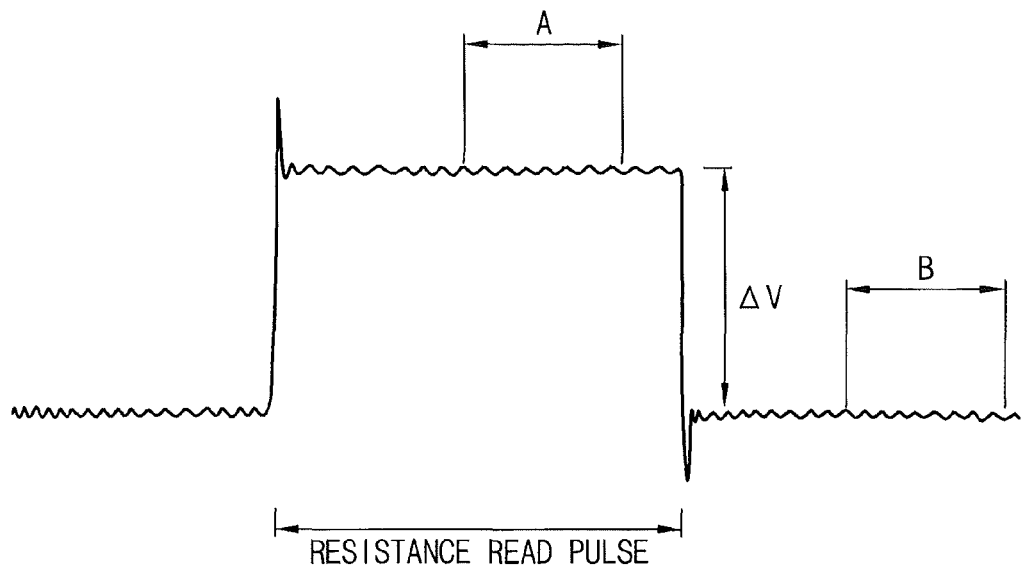
FIG. 11 is a schematic waveform illustration showing a smoothed average pulse waveform.

FIG. 11 is a schematic waveform illustration showing a smoothed average pulse waveform.

Referring to FIG. 11, a first period A and a second period B in the average pulse waveform may be determined. The first period A may be located in the resistance read pulse. The second period B may be located in a base level waveform at both ends of the resistance read pulse. The first period A may be scanned to measure a plurality of first drop voltages. The first drop voltages may be averaged to obtain a first average drop voltage. The second period B may be scanned to measure a plurality of second drop voltages. The second drop voltages may be averaged to obtain a second average drop voltage. A difference between the first average drop voltage and the second average drop voltage may be calculated. The voltage difference may correspond to the drop voltage ΔV.

Here, when the drop voltage ΔV may be measured at one point in the average pulse waveform, measurement errors may be increased due to noises. Therefore, the drop voltage ΔV may be accurately measured by scanning the periods in the average pulse waveform.

In step S34, a total current hot flowing through the cell of the resistive memory device may be obtained from the drop voltage ΔV and an internal resistance Rosc of the oscilloscope.

In step S36, a resistance of the cell in which the data may be written may be obtained using the total current Itot and the voltage Vread of the resistance read pulse P2. In some example embodiments, the process for obtaining the resistance of the cell may be substantially the same as that illustrated with reference to FIG. 7. Thus, any further illustrations with respect to the same process are omitted herein for brevity.

According to this example embodiment, it may be noted that the resistance of the cell may be increased in proportion to the delay time after writing the data "1" in the phase changeable memory device. Thus, a read sensing margin and a read determining voltage may be accurately set by measuring the resistances by the delay times after writing the data "1".

Figure 12:
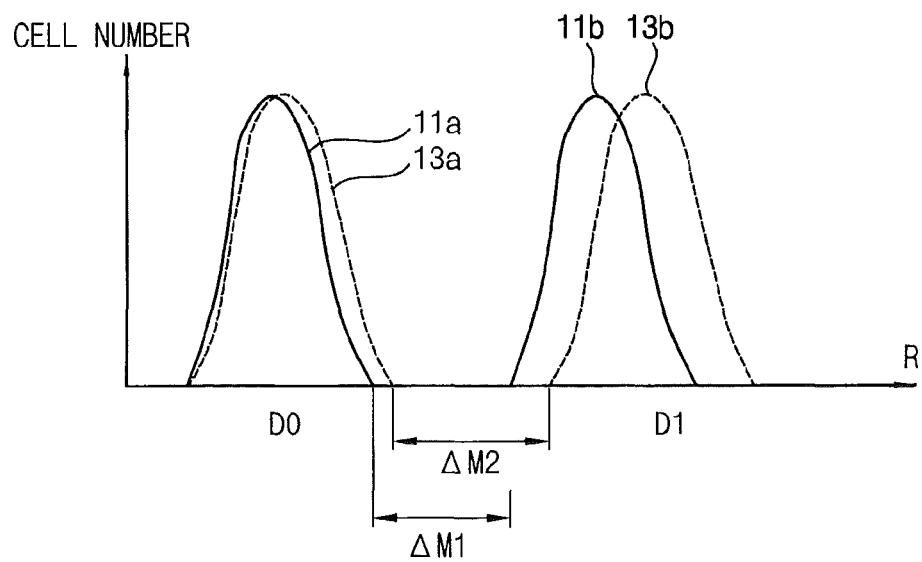
FIG. 12 is a graph showing a set resistance and a reset resistance of a phase changeable memory device in accordance with time delay just after writing data.

FIG. 12 is a graph showing a set resistance and a reset resistance of a phase changeable memory device in accordance with time delay just after writing data.

Referring to FIG. 12, after hundreds of nano seconds from writing the data "1" in the cell of the phase changeable memory device, the cell may have a low reset resistance. Further, the reset resistance may be increased in proportion to a delay time after writing the data "1" in the cell. In contrast, after writing the data "0" in the cell of the phase changeable memory device, a difference between set resistances due to the delay time may be small.

In FIG. 12, reference numeral 11a may indicate a resistance after about 100 ns from writing the data '0'. Reference numeral 11b may represent a resistance after 100 ns from writing the data "1". Reference numeral 13a may indicate a resistance after about 1 second from writing the data '0'. Reference numeral 13b may represent a resistance after 1 second from writing the data "1".

In FIG. 12, ΔM1 may indicate a margin between the set resistance and the reset resistance after 100 ns from writing the data. ΔM2 may indicate a margin between the set resistance and the reset resistance after 1 second from writing the data.

Therefore, when the data may be read after hundreds of nano seconds from writing the data, a sense amplifier may not accurately discriminate between the set state and the reset state. Further, the sense amplifier may determine the reset state as the set state. Thus, a time from writing the data in the cell to sensing the data may be obtained based on the resistance of the phase changeable memory device. Therefore, a time margin for reading the data may be accurately obtained after writing the data in the cell.

Further, because the reset resistance may be low just after writing the data "1", a current may be increased, so that a voltage of a sensing node at the reset state may be decreased. Therefore, a margin between voltages of the reset state and the set state may be reduced. As a result, a verification voltage for discriminating between the data "0" and "1" may be precisely set based on the reduced margin.

Figure 13:
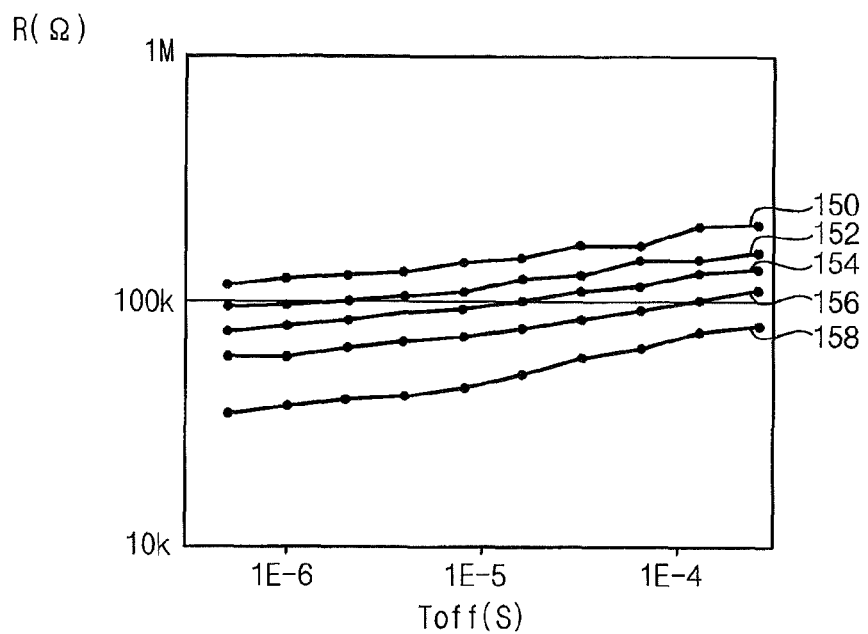
FIG. 13 is a graph showing a resistance by time delays after writing a data "1" in the phase changeable memory device.

FIG. 13 is a graph showing resistances by time delays after writing a data "1" in the phase changeable memory device. Here, the resistances may be measured under different resistance read voltages.

In FIG. 13, reference numerals may represent following resistance read voltages, respectively, in following Table 2.

TABLE 2

|  | Reference numeral | | | | |
| --- | --- | --- | --- | --- | --- |
|  | 150 | 152 | 154 | 156 | 158 |
| Resistance read voltage | 0.3 V | 0.4 V | 0.5 V | 0.6 V | 0.7 V |

As shown in FIG. 13, it may be noted that the resistance of the cell in the phase changeable memory device may be increased in proportion to decreasing the resistance read voltages.

Further, it may be noted that the resistance of the cell in the phase changeable memory device may be increased in proportion to increasing the delay time after writing the data "1" in the cell.

Particularly, the resistance may be accurately measured just after about 100 ns from writing the data "1" in the phase changeable memory device.

Figure 14:
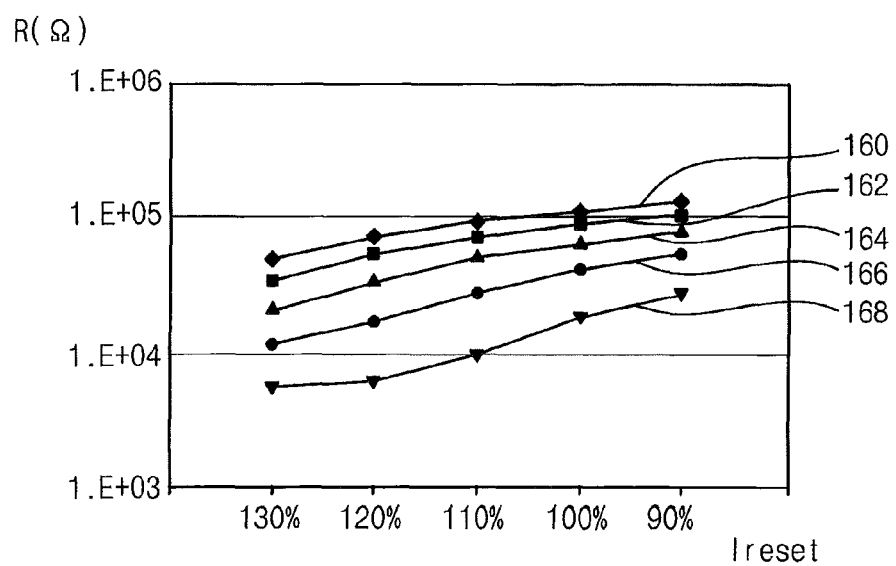
FIG. 14 is a graph showing a resistance of the phase changeable memory device having different reset currents.

FIG. 14 is a graph showing resistances of the phase changeable memory device having different reset currents.

The resistances of the phase changeable memory device may be measured under conditions that the delay time may be set as about 1 μs after writing the data '1" in the cell. Further, the resistances may be measured under different resistance read voltages.

In FIG. 14, reference numerals may represent following resistance read voltages, respectively, in following Table 3.

TABLE 3

| | Reference numeral | | | | |
|---|---|---|---|---|---|
| | 160 | 162 | 164 | 166 | 168 |
| Resistance read voltage | 0.2 V | 0.3 V | 0.4 V | 0.5 V | 0.6 V |

The resistances of the phase changeable memory devices, which may have a reset current substantially the same as, a reset current by about 10% greater than, a reset current by about 20% greater than, and a reset current by about 30% greater than a normal current, respectively, may be measured. As shown in FIG. 14, it may be noted that the reset current greater than the normal current may flow through the phase changeable memory device.

In contrast, the resistance of the phase changeable memory device, which may have a reset current by about 10% less than the normal current, respectively, may be measured. As shown in FIG. 14, it may be note that the reset current less than the normal current may flow through the phase changeable memory device.

Referring to FIG. 14, the phase changeable memory device having the relatively high reset current may have the relatively low resistance. Thus, it may be noted that the resistance of the phase changeable memory device may be accurately measured using the methods of these example embodiments. Further, because the resistances by the reset currents of the phase changeable memory device may be precisely obtained, the reset current of the phase changeable memory device may be determined by measuring the resistance of the phase changeable memory device. As a result, accurate information with respect to operational characteristics of the phase changeable memory device may be obtained.

According to these example embodiments, the resistance may be accurately measured just after about several to hundreds nano seconds from writing the data in the resistive memory device. The measured resistance may be used for determining operational characteristics and reliability of the resistive memory device, and for setting the read sensing margin and data determination voltage of the resistive memory device such as a phase changeable memory device, a magnetic memory device, a ferroelectric memory device, etc.

The foregoing is illustrative of example embodiments and is not to be construed as limiting thereof. Although a few example embodiments have been described, those skilled in the art will readily appreciate that many modifications are possible in the example embodiments without materially departing from the novel teachings and advantages of the present invention. Accordingly, all such modifications are intended to be included within the scope of the present invention as defined in the claims. In the claims, means-plus-function clauses are intended to cover the structures described herein as performing the recited function and not only structural equivalents but also equivalent structures. Therefore, it is to be understood that the foregoing is illustrative of various example embodiments and is not to be construed as limited to the specific example embodiments disclosed, and that modifications to the disclosed example embodiments, as well as other example embodiments, are intended to be included within the scope of the appended claims.

What is claimed is:

1. A method of measuring a resistance of a memory cell in a resistive memory device, the method comprising:
    applying a data write pulse to a selected cell of the resistive memory device;
    applying a resistance read pulse to the selected cell after a delay time measured from a time of applying the data write pulse;
    measuring a drop voltage at the cell responsive to a pulse waveform output when applying the resistance read pulse to the selected cell;
    measuring a total current through the cell using the drop voltage and an internal resistance of a test device coupled to the cell; and
    determining a resistance of the resistive memory device using the total current and a voltage of the resistance read pulse.

2. The method of claim 1, wherein the resistive memory device comprises a phase changeable memory device or a magnetic memory device.

3. The method of claim 1, wherein the delay time is adjusted to determine the resistance at different times after the time of applying the data write pulse.

4. The method of claim 3, further comprising:
    determining the resistance at a specific time between an end point of the data write pulse and a stabilization period in the resistance read pulse.

5. The method of claim 4, wherein the specific time is about 10ns to about 1 second.

6. The method of claim 4, wherein the stabilization period comprises about a halfway point to about an end point in the resistance read pulse.

7. The method of claim 1, wherein the data write pulse and the resistance read pulse are applied from different channels of a single pulse generator, two different pulse generators or a single channel of the single pulse generator.

8. The method of claim 1, wherein measuring the drop voltage comprises:
    repeatedly applying the data write pulse and the resistance read pulse to the cell;
    averaging respective pulse waveforms output from the cells responsive to the repeatedly applying the data write pulse and the resistance read pulse to the cell to obtain an average pulse waveform;
    processing the average pulse waveform to provide a processed average pulse waveform having reduced noise; and
    measuring the drop voltage using the processed average pulse waveform.

9. The method of claim 8, wherein measuring the drop voltage comprises:
    scanning the smoothed average pulse waveform by uniform periods;
    measuring preliminary drop voltages in the periods; and
    averaging the preliminary drop voltages to obtain the drop voltage.

* * * * *